United States Patent [19]

Yamaguchi

[11] Patent Number: 5,550,391
[45] Date of Patent: Aug. 27, 1996

[54] LIGHT-EMITTING DIODE AND LIGHT-EMITTING DIODE ARRAY

[75] Inventor: Kiyoshi Yamaguchi, Sendai, Japan

[73] Assignee: Ricoh Company, Ltd., Tokyo, Japan

[21] Appl. No.: 259,547

[22] Filed: Jun. 14, 1994

[30] Foreign Application Priority Data

| Jun. 18, 1993 | [JP] | Japan | 5-148106 |
| Sep. 7, 1993 | [JP] | Japan | 5-222544 |
| May 27, 1994 | [JP] | Japan | 6-114828 |

[51] Int. Cl.$^6$ .......................... H01L 33/00; H01L 29/861
[52] U.S. Cl. .............................. 257/96; 257/94; 257/102
[58] Field of Search ............................. 257/96, 94, 102

[56] References Cited

U.S. PATENT DOCUMENTS

| 4,720,468 | 1/1988 | Menigaux et al. | 437/129 |
| 4,857,944 | 8/1989 | Hart et al. | 346/154 |
| 4,897,672 | 1/1990 | Horiuchi et al. | 346/107 R |
| 4,936,808 | 6/1990 | Lee | 357/19 X |
| 4,952,949 | 8/1990 | Uebbing | 346/154 |
| 4,999,310 | 3/1991 | Kim . | |
| 5,091,757 | 2/1992 | Yoshida | 357/17 |
| 5,115,442 | 5/1992 | Lee et al. . | |
| 5,117,477 | 5/1992 | Satoh | 385/88 |
| 5,200,605 | 4/1993 | Satoh | 250/214 |
| 5,264,849 | 11/1993 | Kondoh et al. | 341/137 |
| 5,272,362 | 12/1993 | Yagi et al. | 257/96 |
| 5,291,033 | 3/1994 | Morishima | 257/96 |
| 5,294,815 | 3/1994 | Iechi | 257/95 |
| 5,307,200 | 4/1994 | Yoshida | 359/248 |
| 5,357,123 | 10/1994 | Sugawara | 257/88 |

FOREIGN PATENT DOCUMENTS

| 0208527 | 1/1987 | European Pat. Off. | H01L 27/15 |
| 60-32373 | 2/1985 | Japan | H01L 33/00 |
| 3237784 | 10/1991 | Japan . | |

OTHER PUBLICATIONS

National Convention Record, The Institute of Electronic Communication Engineers, pp. 1–211, 1980.

Iitsuka et al., Development of an LED Printhead for High Speed and High Quality Image Printing, Hitachi Cable Review, No. 8, Aug. 1989, pp. 65–70.

Tanno et al., LED Printer, The Institute of Electrophotography, vol. 1, No. 29, 1990, pp. 38–46.

*Primary Examiner*—Stephen D. Meier
*Attorney, Agent, or Firm*—Cooper & Dunham LLP

[57] ABSTRACT

A light-emitting diode of a surface emitting type having a light-emitting part of a double heterostructure is constructed such that a drive current is concetrated in the light-emitting part beneath a light-emitting window, by forming a current block region beneath a contact provided adjacent the light-emitting window.

12 Claims, 6 Drawing Sheets

LIGHT-EMITTING DIODE AND LIGHT-EMITTING DIODE ARRAY

BACKGROUND OF THE INVENTION

The present invention relates to light-emitting diodes and light-emitting diode arrays. The light-emitting diode and the light-emitting diode array of the present invention can be used as a signal source in an optical signal transmission system or a light source in an optical printer. Particularly, the light-emitting diode array of the present invention can be used as a light source in an optical printer in which a solid scan method (a method whereby an image having the same size as the original is formed on a photosensitive body by means of a light-emitting array) is employed.

Usually, a surface emitting diode is used as a light source in an optical printer or an optical signal transmission system. A surface emitting diode is constructed such that a film-like contact is formed on a part of a cap layer formed on tope of a semiconductor film layers forming a light-emitting part, and the surface of an insulating film formed on that part of the surface of the cap layer which is not provided with the contact acts as a light-emitting window.

Such a conventional surface emitting diode has the following drawbacks.

When a drive current is applied to the surface emitting diode for light emission, the drive current density is greatest at semiconductor film layers beneath the contact formed on the cap layer, and the intensity of light emission is at a maximum level in this region.

However, since the greater part of light emitted in the semiconductor film layers beneath the contact is reflected by a film-like contact, optical output cannot be effectively obtained through the light-emitting window, resulting in a relatively low light-production efficiency.

SUMMARY OF THE INVENTION

Accordingly, a general object of the present invention is to provide a novel and useful light-emitting diode and a light-emitting diode array which have a high light-production efficiency.

Another and more specific object of the present invention is to provide a novel and useful light-emitting diode and a light-emitting diode array which have a high light-production efficiency, and in which degradation in the light-production efficiency is effectively prevented.

Another and more specific object of the present invention is to provide a novel and useful light-emitting diode and a light-emitting diode array which has a high light-production efficiency, and in which degradation in the light-production efficiency is effectively prevented and the distribution of the intensity in light emission in the light-emitting part is effectively made to be uniform.

In order to achieve the aforementioned objects, the present invention provides a light-emitting diode of a surface emitting type having light-emitting part of a double heterostructure, wherein a driving current is concentrated in a light-emitting part beneath the light-emitting window by forming a current block region beneath a film-like contact provided adjacent the light-emitting window.

Preferably, semiconductor films are built on a semiconductor substrate so that a layered structure having a pnpn electric conduction type is formed such that, of the structure, one of the two semiconductor films, having the same electric conduction type as the semiconductor substrate, which film is further away from the semiconductor substrate than the other, is used as a current block layer, and the pn structure adjacent the semiconductor substrate is used as a light-emitting part having a double hetero structure, and impurities having the conduction type opposite to that of the semiconductor substrate are implanted in the current block layer beneath the light-emitting window. In this case, impurities are implanted in a part of the semiconductor film formed as a current block layer so that the current block function thereof is canceled and that part of the current block layer which is beneath the contact becomes a current block region.

The present invention also provides a light-emitting diode, wherein semiconductor films are built on a semiconductor substrate so that a layered structure having a pn electric conduction type is formed so as to constitute a light-emitting part having a double heterostructure, and wherein a current block region having a high resistance is formed by implanting impurities beneath a contact.

A light-emitting diode array of the present invention is constructed monolithically such that a plurality of light-emitting diodes are arrayed.

The present invention also provides a light-emitting diode of a surface emitting type having a light-emitting part of a double heterostructure, wherein semiconductor films are built on an n-type semiconductor substrate so that a layered structure having an npnp electric conduction type, viewed from the semiconductor substrate, is formed such that, one of the two n-type semiconductor films in the structure, which film is further away from the semiconductor substrate than the other, is used as a current block layer, and the np structure adjacent the semiconductor substrate is used as a light-emitting part having a double hetero structure, p-type impurities are implanted in the current block layer beneath the light-emitting window, and a drive current is concentrated in the light-emitting part beneath the light-emitting window by forming the current block region beneath the film-like contact provided adjacent the light-emitting window.

The present invention also provides a light-emitting diode of a surface emitting type having a light-emitting part of a double heterostructure, wherein semiconductor films are built on a p-type semiconductor substrate so that a layered structure having a pnpn electric conduction type, viewed from the semiconductor substrate, is formed such that, one of the two p-type semiconductor films in the structure, which film is further away from the semiconductor substrate than the other, is used as a current block layer, and the pn structure adjacent the semiconductor substrate is used as a light-emitting part having a double heterostructure, the current block layer beneath the light-emitting window is doped with n-type impurities by an ion implantation method, and a drive current is concentrated in the light-emitting part beneath the light-emitting window by forming the current block region beneath the film-like contact provided adjacent the light-emitting window.

The present invention also provides a light-emitting diode of a surface emitting type having a light-emitting part of a double heterostructure, wherein semiconductor films having an electric conduction type of n, p(−) and p(+) are built in the stated order on an n-type semiconductor substrate so that the p(−) type semiconductor film is used as a current block layer, p-type impurities are implanted in the current block layer beneath the light-emitting window by an ion implantation method, and a drive current is concentrated in the light-emitting part beneath the light-emitting window by forming the current block region beneath the film-like contact provided adjacent the light-emitting window.

In the foregoing, p(−) denotes a p conduction type film having a comparatively low carrier density, and p(+) denotes a p conduction type film having a comparatively high carrier density.

The present invention also provides a light-emitting diode of a surface emitting type having a light-emitting part of a double heterostructure, wherein semiconductor films having an electric conduction type of p, n(−) and n(+) are built in the stated order on a p-type semiconductor substrate so that the n(−) type semiconductor film is used as a current block layer, n-type impurities are implanted in the current block layer beneath the light-emitting window by an ion implantation method, and a drive current is concentrated in the light-emitting part beneath the light-emitting window by forming the current block region beneath the film-like contact provided adjacent the light-emitting window.

In the foregoing, n(−) denotes an n conduction type film having a comparatively low carrier density, and n(+) denotes an n conduction type film having a comparatively high carrier density.

The aim of doping the current block layer with impurities is to cancel the current block function and to form a current path therein.

In another preferred embodiment of the present invention, there is provided a light-emitting diode of a surface emitting type having a light-emitting window of a double structure, wherein semiconductor films are built on an n-type semiconductor substrate so that a layered structure having an np electric conduction type, viewed from the semiconductor substrate, is formed a drive current is concentrated in the light-emitting part beneath the light-emitting window by doping the p-type semiconductor film beneath a film-like contact provided adjacent the light-emitting window with n-type impurities by an ion implantation method so as to form a current block region.

In another preferred embodiment of the present invention, there is provided a light-emitting diode of a surface emitting type having a light-emitting window of a double structure, wherein semiconductor films are built on a p-type semiconductor substrate so that a layered structure having a pn electric conduction type, viewed from the semiconductor substrate, is formed, a drive current is concentrated in the light-emitting part beneath the light-emitting window by doping the n-type semiconductor film beneath a film-like contact provided adjacent the light-emitting window with p-type impurities by an ion implantation method so as to form a current block region.

In still another preferred embodiment of the present invention, there is provided a light-emitting diode of a surface emitting type having a light-emitting window of a double structure, wherein semiconductor films are built on an n-type semiconductor substrate so that a layered structure having an np electric conduction type, viewed from the semiconductor substrate, is formed, a drive current is concentrated in the light-emitting part beneath the light-emitting window by doping the n-type semiconductor film beneath a film-like contact provided adjacent the light-emitting window with p-type impurities by an ion implantation method so as to form a current block region.

In still another preferred embodiment of the present invention, there is provided a light-emitting diode of a surface emitting type having a light-emitting window of a double structure, wherein semiconductor films are built on a p-type semiconductor substrate so that a layered structure having a pn electric conduction type, viewed from the semiconductor substrate, is formed, a drive current is concentrated in the light-emitting part beneath the light-emitting window by doping the p-type semiconductor film beneath a film-like contact provided adjacent the light-emitting window with n-type impurities by an ion implantation method so as to form a current block region.

In the above described four preferred embodiments, the part doped with impurities is provided with a current block function so as to become a current block region.

The present invention also provides a light-emitting diode of a surface emitting type having a light-emitting part of a double heterostructure, wherein semiconductor films are built on a semiconductor substrate so that a layered structure having a pnpn electric conduction type is formed such that, of the structure, one of the two semiconductor films, having the same electric conduction type as the semiconductor substrate, which film is further away from the semiconductor substrate than the other, is used as a current block layer, and the pn structure adjacent the semiconductor substrate is used as a light-emitting part having a double hetero structure, the current block layer beneath the light-emitting window is doped, by an ion implantation method, with impurities having an electric conduction type different from that of the semiconductor substrate such that the density of the impurities is gradually higher away from a region beneath a film-like contact provided adjacent the light-emitting window toward the light-emitting window, in a direction parallel to the surface of the semiconductor substrate, and a drive current is concentrated in the light-emitting part beneath the light-emitting window by forming the current block region beneath the film-like contact provided adjacent the light-emitting window.

A light-emitting diode array of the present invention may also be constructed monolithically such that a plurality of light-emitting diodes are arrayed straight on a same semiconductor substrate.

BRIEF DESCRIPTION OF THE DRAWINGS

Other objects and further feature of the present invention will be apparent from the following detailed description when read in conjunction with the accompanying drawings, in which.

DESCRIPTION OF THE PREFERRED EMBODIMENTS

Figure 1A:
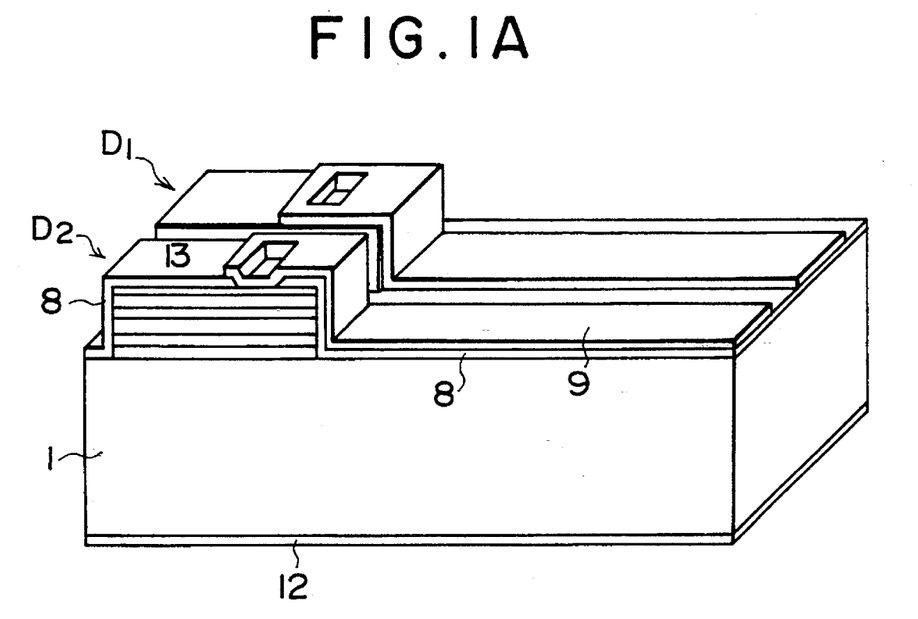
FIG. 1A illustrates a light-emitting diode array of the present invention.

FIG. 1A shows a light-emitting diode array wherein diodes according to embodiments of the present invention are arranged.

FIG. 1A shows a cross section of a light-emitting diode array obtained by cutting through the array by a plane at right angles with the direction in which the light-emitting diodes are arranged, the cutting being done in a second light-emitting diode counting from the end of the array. It is to be noted that there are shown two light-emitting diodes $D_1$ and $D_2$ constituting a part of the light-emitting diode array at the end thereof.

The individual light-emitting diodes $D_1$ and $D_2$ constituting the light-emitting diode array have the same construction. A description of this construction will be given by taking an example of the light-emitting diode $D_2$. Referring to FIG. 1A, a film-like wiring contact 9 is formed adjacent a light-emitting window 13. In other words, the wiring contact 9 is connected to the light-emitting window 13.

Figure 1B:
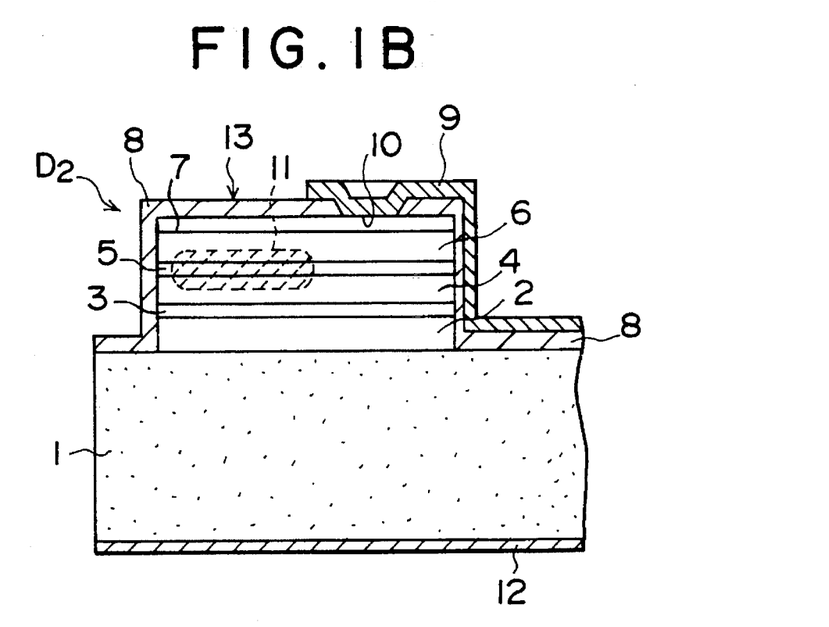
FIG. 1B illustrates a light-emitting diode according to a first embodiment of the present invention.

FIG. 1B shows a cross section of the light-emitting diode $D_2$ according to a first embodiment. On the surface of a semiconductor (n-GaAs) substrate 1 are formed semiconductor films including an n-$Al_{0.4}Ga_{0.6}As$ (carrier density: $5\times10^{18}$, film thickness: 1 μm) clad layer 2, an n-$Al_{0.2}Ga_{0.8}As$ (carrier density: $5\times10^{17}$, film thickness: 0.15 μm) light-emitting layer 3 a p-$Al_{0.4}Ga_{0.6}As$ (carrier density: $5\times10^{18}$, film thickness: 1 μm) clad layer 4, an n-$Al_{0.4}Ga_{0.6}As$ (carrier density: $1\times10^{19}$, film thickness: 0.1 μm) current block layer 5, a p-$Al_{0.4}Ga_{0.6}As$ (carrier density: $5\times10^{18}$, film thickness: 0.2 μm) clad layer 6, and a p-GaAs (carrier density: $1\times10^{19}$, film thickness: 0.01 μm) cap layer 7, in the stated order from bottom to top. That is, the n-$Al_{0.4}Ga_{0.6}As$ clad layer 2 is formed nearest the semiconductor substrate 1.

The pn regions of the clad layer 2, the light-emitting layer 3 and the clad layer 4 constitute a light-emitting part having a double heterostructure. The current block layer 5 constitute a second n-layer in the pnpn structure formed on the semiconductor substrate 1, the second n-layer being further away from the semiconductor substrate than a first n-layer in the same structure.

An insulating layer 8 covers the film layers formed of semiconductor films 2–7. The film-like wiring contact 9 formed on the insulating layer 8 is an Al film and is in contact with the cap layer 7 through a contact hole 10 bored in the insulating layer 8.

There are p-type impurities implanted in a region 11 beneath the light-emitting window 13, the center of the region 11 being located in the current block layer 5. Due to the implanted p-type impurities, the region 11 has the same electric conduction type as the p-type region on either side of the current block layer 5, so that the current block function characteristic of the current block layer 5 is canceled locally. Hence, the region having the current block function of the current block layer 5 is formed beneath the contact 9.

The entire underside of the semiconductor substrate 1 is provided with an Au/AuGe contact film 12 which serves as a contact shared by the light-emitting diodes.

When a voltage is applied between the wiring contact 9 and the contact film 12, a drive current flows from the wiring contact 9 to the contact film 12. Since the current block function of the current block layer 5 is effective beneath the wiring contact 9, the current becomes concentrated in the region 11. Therefore, an emission of bright light in the light-emitting part beneath the region 11 results. The emitted light is effectively output through the light-emitting part 13 as a light output without being reflected by the wiring contact 9. Accordingly, a high light-production efficiency is obtained.

A description will now be given of an example of a process of producing the light-emitting diode array formed of the diodes according to the first embodiment.

First, a metal organic vapor phase epitaxial growth method is employed to sequentially form, on the n-GaAs semiconductor substrate 1, the clad layer 2, the light-emitting layer 3, the clad layer 4, the current block layer 5, the clad layer 6 and the cap layer 7.

Subsequently, a normal photolithography and an ion implantation method are employed to form the region 11 by implanting p-type impurities in the region beneath a target part which is intended to be the light-emitting window, the center of implantation being located in the current block layer 5. Then, the dry etching which reaches the semiconductor substrate 1 is conducted by ECR-RIBE so that the whole of the layers of semiconductor films is segmented to form individual light-emitting diodes.

The insulating layer 8 is formed by a plasma phase growth method, and a contact hole is bored in the insulating layer 8 on top of the cap layer 7 by a normal photolithographic method and a wet etching technology. Then, a DC sputtering method and a reactive ion etching method are employed to form the wiring contact 9, whereupon the contact film 12 is formed on the underside of the semiconductor substrate 1 by an electron beam deposition method.

Figure 2:
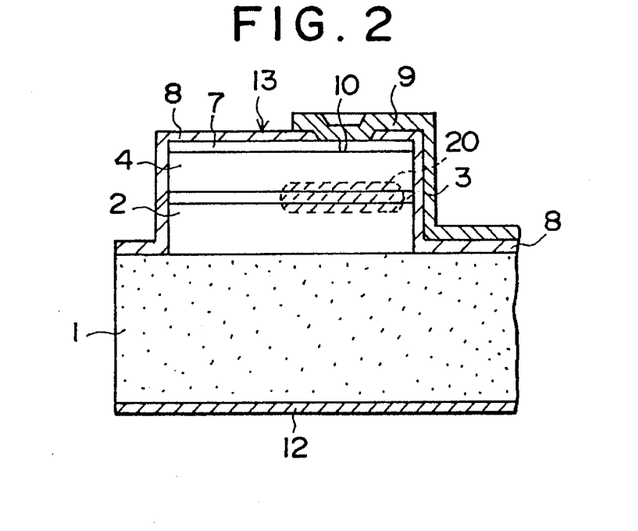
FIG. 2 illustrates a light-emitting diode according to a second embodiment.

FIG. 2 shows a light-emitting diode according to a second embodiment. The diodes according to this embodiment are also arranged in the light-emitting diode array in the same arrangement as the light-emitting diodes according to the first embodiment are arranged as shown in FIG. 1A.

For the sake of simplicity of the drawings, those parts that are essentially the same as the parts shown in FIG. 1B are designated by the same reference numerals.

On the surface of the n-GaAs semiconductor substrate 1 are formed semiconductor films including an n-$Al_{0.4}Ga_{0.6}As$ (carrier density: $5\times10^{18}$, film thickness: 1 μm) clad layer 2, an n-$Al_{0.2}Ga_{0.8}As$ (carrier density: $5\times10^{17}$, film thickness: 0.15 μm) active layer 3, a p-$Al_{0.4}Ga_{0.6}As$ (carrier density: $5\times10^{18}$, film thickness: 1 μm) clad layer 4, and a p-GaAs (carrier density: $1\times10^{19}$, film thickness: 0.01 μm) cap layer 7, in the stated order from bottom to top. That is, the n-$Al_{0.4}Ga_{0.6}As$ clad layer 2 is formed nearest the semiconductor substrate 1.

Throughout the specification, the carrier density is expressed as the number of carriers per cubic centimeters ($cm^3$).

The clad layer 2, the active layer 3 and the clad layer 4 constitute a light-emitting part having a double heterostructure. The insulating layer 8 covers the film layers formed of the semiconductor films 2–4 and 7. The film-like Al wiring contact 9 formed on the insulating layer 8 is in contact with the cap layer 7 through the contact hole 10 bored in the insulating layer 8.

Insulating impurities H (+) (positive hydrogen ions) are implanted in a region beneath the end of the wiring contact 9 so as to form a current block region 20 having a high resistance. The entirety of the underside of the semiconductor substrate 1 is provided with a Au/AuGe contact film 12 which serves as a contact shared by the light-emitting diodes.

When a voltage is applied between the wiring contact 9 and the contact film 12, a driving current flows from the wiring contact 9 to the contact film 12. Since the current block function of the current block region 20 is effective beneath the wiring contact 9, the current becomes concentrated beneath the light-emitting window 13. Therefore, an emission of bright light in this region results. The emitted light is effectively output through the light-emitting part 13 without being reflected by the wiring contact 9. Accordingly, a high light-production efficiency is obtained.

A schematic description will now be given of the process of producing the light-emitting diode of the second embodiment.

First, a metal organic vapor phase epitaxial growth method is employed to sequentially form, on the n-GaAs semiconductor substrate 1, the clad layer 2, the active layer 3, the clad layer 4 and the cap layer 7. Subsequently, a normal photolithography and an ion implantation method are employed to form the current block region 20 by implanting positive hydrogen ions in the region beneath a target part which is intended to be the wiring contact connected with the light-emitting window.

Then, the dry etching which reaches the semiconductor substrate 1 is conducted by ECR-RIBE so that the whole of the layers of semiconductor films is segmented to form individual light-emitting diodes.

The insulating layer 8 is formed by a plasma phase growth method, and a contact hole is bored in the insulating layer 8 on top of the cap layer 7 by a normal photolithography and a wet etching technology. Then, a DC sputtering method and a reactive ion etching method are employed to form the wiring contact 9, whereupon the contact film 12 is formed on the underside of the semiconductor substrate 1 by an electron beam deposition method.

In the above described embodiments, individual light-emitting diodes are obtained by dividing, as required, the light-emitting diode array produced according to the respective production method.

While GaAs/AlGaAs semiconductors is used in the above described embodiments, it is also possible to use InP/InGaAs semiconductors or the like. Also, while it is assumed in the above described embodiments that a metal organic vapor phase epitaxial growth method is employed as method of growing crystals, it is also possible to use a molecular beam epitaxial method or a liquid phase growth method.

Figure 3:
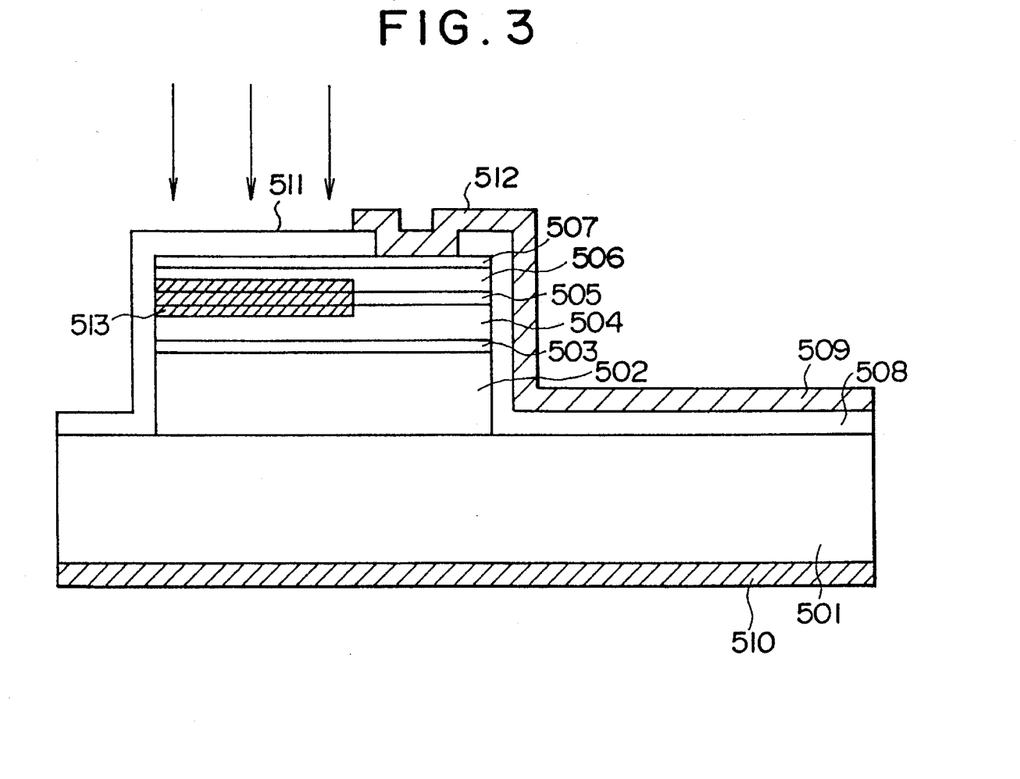
FIG. 3 illustrates a light-emitting diode according to a third embodiment.

FIG. 3 shows, in the same manner as FIG. 1B, a light emitting diode according to a third embodiment. FIG. 3 shows one of the light-emitting diodes arranged in a straight pattern in the light-emitting diode array like the one shown in FIG. 1A and produced in a monolithic manner.

On the surface of an n-GaAs semiconductor substrate 501 are formed semiconductor films including an n-$Al_{0.4}Ga_{0.6}As$ (carrier density: $3\times10^{17}$, film thickness: 1 μm) clad layer 502, an n-$Al_{0.2}Ga_{0.8}As$ (carrier density: $5\times10^{15}$, film thickness: 0.15 μm) light-emitting layer 503, a p-$Al_{0.4}Ga_{0.6}As$ (carrier density: $1\times10^{17}$, film thickness: 0.7 ηm) clad layer 504, an n-$Al_{0.4}Ga_{0.6}As$ (carrier density: $3\times10^{17}$, film thickness 0.2 μm) current block layer 505, a p-$Al_{0.4}Ga_{0.6}As$ (carrier density: $1\times10^{18}$, film thickness: 0.2 μm) current application layer 506 and a p-GaAs (carrier density: $1\times10^{20}$, film thickness: 0.05 μm) cap layer 507, in the stated order from bottom to top. That is, the n-$Al_{0.4}Ga_{0.6}As$ clad layer 2 is formed nearest the semiconductor substrate 501.

The np regions in the clad layer 502, the light-emitting layer 503 and the clad layer 504 constitute a light-emitting part having a double heterostructure, each of the np regions being nearer the semiconductor substrate 501 than the remaining portion of the respective layer. The current block layer 5 constitute a second n-layer further away from the semiconductor substrate 501 than a first n-layer in the npnp structure.

An insulating layer 508 covers the film layers formed of semiconductor films 502–507. A film-like Al wiring contact 509 formed on the insulating layer 508 is in contact with the cap layer 507 through a contact hole 512 bored in the insulating layer 508.

An ion implantation method is employed to implant p-type impurities $^9Be(+)$ (+ in the parenthesis indicates that the ions have the positive polarity) beneath a light-emitting window 511 so as to induce a reversal in the pn polarity in the current block layer 505 and to form a p-type impurity implantation region 513, the center of the implantation being located in the current block layer 505.

In this embodiment, the current block 505 and the current application layer 506 are located between the light-emitting layer 503 and the light-emitting window 511. Hence, for light from the light-emitting layer 503 to be efficiently output through the light-emitting window 511, it is necessary to make the energy gap in the current block layer 505 wider than the energy gap in the light-emitting layer 503 so that photons produced in the light-emitting layer are prevented from being absorbed in the current block layer 505.

When the light-emitting diode is formed of an AlGaAs material as in this embodiment, the widening of an energy gap requires an increase in the ratio of the Al portion of the entire composition of the material. Supposing that the light-emitting diode of this embodiment is used as a light source in optical recording, and allowing for a compatibility with a conventional laser raster type light source also used in a recording unit, it is desirable that the ratio of the Al portion in the material forming the light-emitting layer 503 is approximately 0.2, at which it is possible to obtain a frequency substantially the same as that of a laser light source.

It is then required that the ratio of the Al portion in the current block layer 50 is larger than 0.2, for example, 0.4 as in this embodiment.

When the ratio of the Al portion becomes great, it becomes difficult to obtain a film having a large carrier density on account of degradation of the quality of crystals. The carrier density specification provided in the foregoing description derives from this consideration. When the semiconductor films 504, 505 and 506 have the carrier density as specified in the foregoing description, the thickness on the order of 0.1 μm is required in the semiconductor films 505 and 506 (current block layer, current application layer), considering the width of the depletion layer in the boundary between the semiconductor layers 504 and 505 and in the boundary between the semiconductor layers 505 and 506.

Consequently, a relatively great ion implantation depth on the order of 0.1 μm is required in forming the p-type impurity implantation region 513 in the current block layer 505. $^9Be(+)$ is suitable for creating such a deep implantation layer because of its small weight.

Due to the implanted p-type impurities $^9Be(+)$, the p-type impurity implantation region 513 has the same electric conduction type as the semiconductor films 504 and 506 on either side of the current block layer 505, so that the current block function characteristic of the current block layer 505 is canceled locally.

Hence, the region having the current block function of the current block layer 505 is formed beneath the contact 509. The entire underside of the semiconductor substrate 501 is provided with an Au/Ni/Au-Ge contact film 510 which serves as a contact shared by the light-emitting diodes.

When a voltage is applied between the wiring contact 509 and the contact film 510, a drive current flows from the wiring contact 509 to the contact film 510. Since the current block function of the current block layer 505 is effective beneath the wiring contact 509, the current becomes concentrated in the p-type impurity implantation region 513. Therefore, an emission of bright light in the light-emitting part beneath the region 513 results. The emitted light is effectively output through the light-emitting part 511 without being reflected by the wiring contact 509. Accordingly, a high light-production efficiency is obtained.

Since the use of $^9$Be(+), which is selected as implanted impurities in this embodiment, ensures that a high activation yield is obtained under a thermal process of relatively low temperature, it affects, in an activation process, the carrier density profile in the crystal growth layer to a smaller degree than other implantation materials.

A schematic description will now be given of an example of the process of producing the light-emitting diode according to the third embodiment described above.

First, a metal organic vapor phase growth method or a molecular beam epitaxial method is employed to sequentially form, on the n-GaAs semiconductor substrate 501, the semiconductor films 502–507.

Subsequently, a normal photolithography and an ion implantation method are employed to form the p-type impurity implantation region 513 by implanting p-type impurities ($^9$Be(+)) in the region beneath a target part which is intended to be the light-emitting window, and by inducing a reversal in the pn polarity in the current block layer 505, the center of the implantation being located in the current block layer 505. The implanted ions are then activated by RTA. Then, the dry etching which reaches the semiconductor substrate 501 is conducted by ECR-RIBE so that the whole of the layers of semiconductor films is segmented to form individual light-emitting diodes.

Thereafter, the insulating layer 508 is formed by a plasma phase growth method, and a contact hole is bored in the insulating layer 508 on top of the cap layer 507 by a normal photolithography and a wet etching technology. Then, a DC sputtering method and a reactive ion etching method are employed to form the Al wiring contact 509, whereupon the contact film 510 is formed on the underside of the semiconductor substrate 1 by a resistance heating evaporation method.

Figure 4:
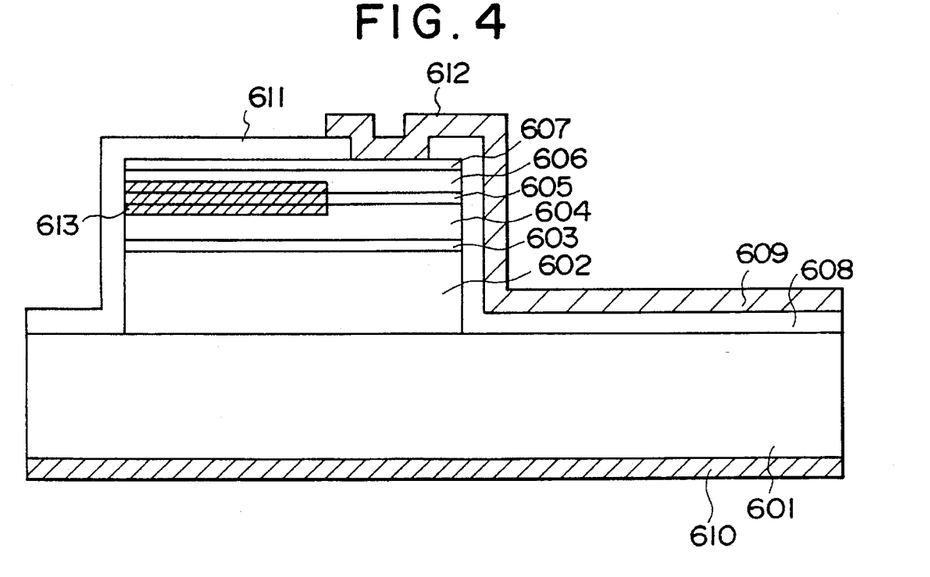
FIG. 4 illustrates a light-emitting diode according to a fourth embodiment.

FIG. 4 shows, in the same manner as FIG. 1B, a light emitting diode according to a fourth embodiment. FIG. 4 shows one of the light-emitting diodes arranged in a straight pattern in the light-emitting diode array like the one shown in FIG. 1A and produced in a monolithic manner.

On the surface of an p-GaAs semiconductor substrate 601 are formed semiconductor films including a p-$Al_{0.4}Ga_{0.6}As$ (carrier density: $5\times10^{17}$, film thickness: 1 μm) clad layer 602, an n-$Al_{0.2}Ga_{0.8}As$ (carrier density: $5\times10^{15}$, film thickness: 0.15 μm) light-emitting layer 603, an n-$Al_{0.2}Ga0.8As$ (carrier density: $3\times10^{17}$, film thickness: 0.7 μm) clad layer 604, a p-$Al_{0.4}Ga_{0.6}As$ (carrier density: $1\times10^{18}$, film thickness 0.1 μm) current block layer 605, an n-$Al_{0.4}Ga_{0.6}As$ (carrier density: $3\times10^{17}$, film thickness: 0.2 μm) current application layer 606 and an n-GaAs (carrier density: $3\times10^{18}$, film thickness: 0. 05 μm) cap layer 607, in the stated order from bottom to top. That is, the p-$Al_{0.4}Ga_{0.6}As$ clad layer 602 is formed nearest the semiconductor substrate 601.

The pn regions in the clad layer 602, the active layer 603 and the clad layer 604 constitute a light-emitting part having a double heterostructure, each of the np regions being nearer the semiconductor substrate 601 than the remaining portion of the respective layer. The current block layer 605 constitute a second p-layer further away from the semiconductor substrate 601 than a first n-layer in the pnpn structure.

An insulating layer 608 covers the film layers formed of semiconductor films 602–607. A film-like Au/Ni/Au-Ge/Cr wiring contact 609 formed on the insulating layer 608 is in contact with the cap layer 607 through a contact hole 612 bored in the insulating layer 608.

An ion implantation method is employed to implant n-type impurities $^{28}$Si(−) (− in the parenthesis indicates that the ions have the negative polarity) beneath a light-emitting window 611 so as to induce a reversal in the pn polarity in the current block layer 605 and to form an n-type impurity implantation region 613, the center of the implantation being located in the current block layer 605.

In the fourth embodiment, an ion implantation depth on the order of 0.1 μm is required in forming the n-type impurity implantation region 613 in the current block layer 605 for the same reason as was given in the foregoing description with reference to FIG. 3. $^{28}$Si(−), which is used in this embodiment, is suitable for creating such a deep implantation layer because of its relatively small mass number.

Due to the implanted n-type impurities, the n-type impurity implantation region 613 has the same electric conduction type as the semiconductor films 604 and 606 on either side of the current block layer 605, so that the current block function characteristic of the current block layer 605 is canceled locally. Hence, the region having the current block function of the current block layer 605 is formed beneath the contact 609.

The entire underside of the semiconductor substrate 601 is provided with an Au/Au-Zn contact film 610 which serves as a contact shared by the light-emitting diodes.

When a voltage is applied between the wiring contact 609 and the contact film 610, a drive current flows from the wiring contact 609 to the contact film 610. Since the current block function of the current block layer 605 is effective beneath the wiring contact 609, the current becomes concentrated in the n-type impurity implantation region 613. Therefore, an emission of bright light in the light-emitting part beneath the region 613 results. The emitted light is effectively output through the light-emitting window 611 without being reflected by the wiring contact 609. Accordingly, a high light-production efficiency is obtained.

Since the use of $^{28}$Si(−), which is selected as implanted impurities in this embodiment, ensures that a higher activation yield is obtained under a thermal process of relatively low temperature as compared with other n-type impurities, it affects, in an activation process, the carrier density profile in the crystal growth layer to a smaller degree than other implantation materials.

A schematic description will now be given of an example of the process of producing the light-emitting diode according to the fourth embodiment described above.

First, a metal organic vapor phase growth method or a molecular beam epitaxial method is employed to sequentially form, on the p-GaAs semiconductor substrate 601, the semiconductor films 602–607.

Subsequently, a normal photolithography and an ion implantation method are employed to form the n-type impurity implantation region 613 by implanting n-type impurities ($^{28}$Si(−)) in the region beneath a target part which is intended to be the light-emitting window, and by inducing a reversal in the pn polarity in the current block layer 605, the center of the implantation being located in the current block layer 605. The implanted ions are then activated by RTA. Then, the dry etching which reaches the semiconductor substrate 601 is conducted by ECR-RIBE so that the whole of the layers of semiconductor films is segmented to form individual light-emitting diodes.

Thereafter, the insulating layer 608 is formed by a plasma CVD method, and a contact hole is bored in the insulating layer 608 on top of the cap layer 607 by a normal photolithography and a wet etching technology. Then, a DC sputtering method and a reactive ion etching method are employed to form the Al wiring contact 609, whereupon the contact film 610 is formed on the underside of the semiconductor substrate 601 by a resistance heating evaporation method.

Figure 5:
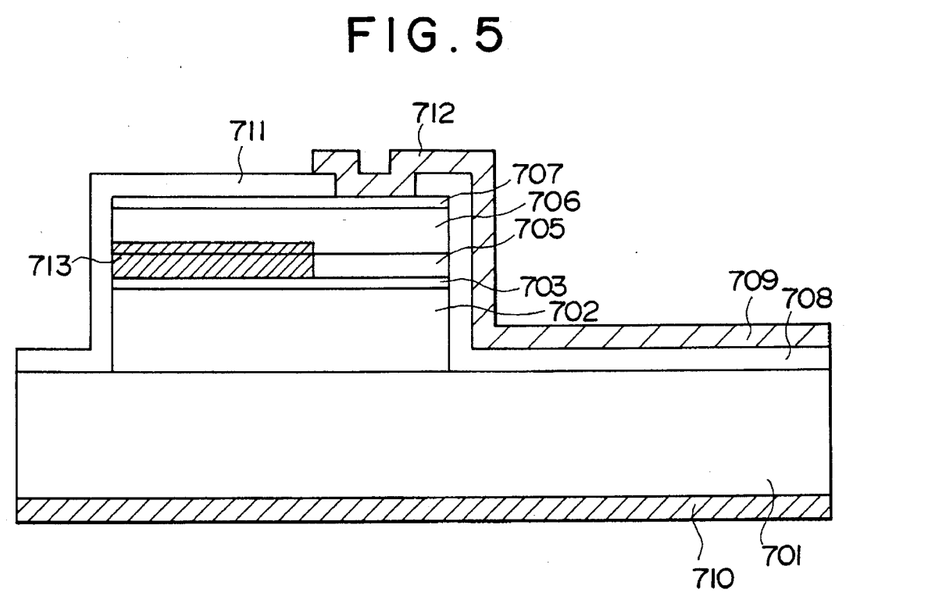
FIG. 5 illustrates a light-emitting diode according to a fifth embodiment.

FIG. 5 shows, in the same manner as FIG. 1B, a light emitting diode according to a fifth embodiment. FIG. 5 shows one of the light-emitting diodes arranged in a straight pattern in the light-emitting diode array like the one shown in FIG. 1A produced in a monolithic manner.

On the surface of an n-GaAs semiconductor substrate 701 are formed semiconductor films including a p-Al$_{0.4}$Ga$_{0.6}$As (carrier density: $3\times10^{17}$, film thickness: 1 μm) clad layer 702, an n-Al$_{0.2}$Ga$_{0.8}$As (carrier density: $5\times10^{15}$, film thickness: 0.15 μm) light-emitting layer 703, a p-Al$_{0.4}$Ga$_{0.6}$As (carrier density: $1\times10^{16}$, film thickness 0.2 μm) current block layer 705 a p-Al$_{0.4}$Ga$_{0.6}$As (carrier density: $2\times10^{18}$, film thickness: 0.3 μm) current application layer 706 and a p-GaAs (carrier density: $1\times10^{20}$, film thickness: 0.05 μm) cap layer 707, in the stated order from bottom to top. That is, the n-Al$_{0.4}$Ga$_{0.6}$As clad layer 702 is formed nearest the semiconductor substrate 701.

The clad layer 702, the light-emitting layer 703, the current block layer 705 and the current application layer 706 constitute a light-emitting part having a double heterostructure. The current block layer 705 constitute a p(−) type film having a low carrier density and a high resistivity.

An insulating layer 708 covers the film layers formed of semiconductor films 702–707. A film-like Al wiring contact 709 formed on the insulating layer 708 is in contact with the cap layer 707 through a contact hole 712 bored in the insulating layer 708.

An ion implantation method is employed to implant p-type impurities $^9$Be(+) beneath a light-emitting window 711 so as to increase the carrier density in the current block layer 705 and to form a p-type impurity implantation region 713, the center of the implantation being located in the current block layer 705.

Consequently, the carrier density increases and the resistivity decreases in the region 713 so that the current block function owing to the high resistivity of the current block layer 705 is canceled locally. Hence, a region having the current block function is left beneath the wiring contact 709.

The current block layer 705 is provided with the current block function by decreasing the carrier density and increasing the resistivity therein. For proper current block function, the thickness of the current block layer 705 is controlled to be 0.2 μm. As a result of this, impurity ions are implanted to a relatively great depth. A high-quality implantation is achieved by using $^9$Be(+), which has a small mass number, as a p-type impurity. Since the use of $^9$Be(+) ensures that a high activation yield is obtained under a thermal process of relatively low temperature, it affects, in an activation process, the carrier density profile in the crystal growth layer to a smaller degree than other implantation materials.

The entire underside of the semiconductor substrate 701 is provided with an Au/Ni/Au-Ge contact film 710 which serves as a contact shared by the light-emitting diodes.

When a voltage is applied between the wiring contact 709 and the contact film 710, a drive current flows from the wiring contact 709 to the contact film 710. Since the current block function of the current block layer 705 is effective beneath the wiring contact 709, the current becomes concentrated in the p-type impurity implantation region 713 beneath the light-emitting window 711. Therefore, an emission of bright light beneath this region results. The emitted light is effectively output through the light-emitting window 711 without being reflected by the wiring contact 709. Accordingly, a high light-production efficiency is obtained.

A schematic description will now be given of an example of the process of producing the light-emitting diode according to the fifth embodiment described above.

First, a metal organic vapor phase growth method or a molecular beam epitaxial method is employed to sequentially form, on a semiconductor substrate 701, the semiconductor films 702–707. Subsequently, a normal photolithography and an ion implantation method are employed to form the p-type impurity implantation region 713 by implanting p-type impurities ($^9$Be(+)) in the region beneath a target part which is intended to be the light-emitting window, the center of the implantation being located in the current block layer 705. The implanted ions are then activated by RTA. Then, the dry etching which reaches the semiconductor substrate 701 is conducted by ECR-RIBE so that the whole of the layers of semiconductor films is segmented to form individual light-emitting diodes. Thereafter, the insulating layer 708 is formed by a plasma CVD method, and a contact hole 712 is bored in the insulating layer 708 on top of the cap layer 707 by a normal photolithography and a wet etching technology. Then, a DC sputtering method and a reactive ion etching method are employed to form the Al wiring contact 709, whereupon the contact film 710 is formed on the underside of the semiconductor substrate 701 by a resistance heating evaporation method.

Figure 6:
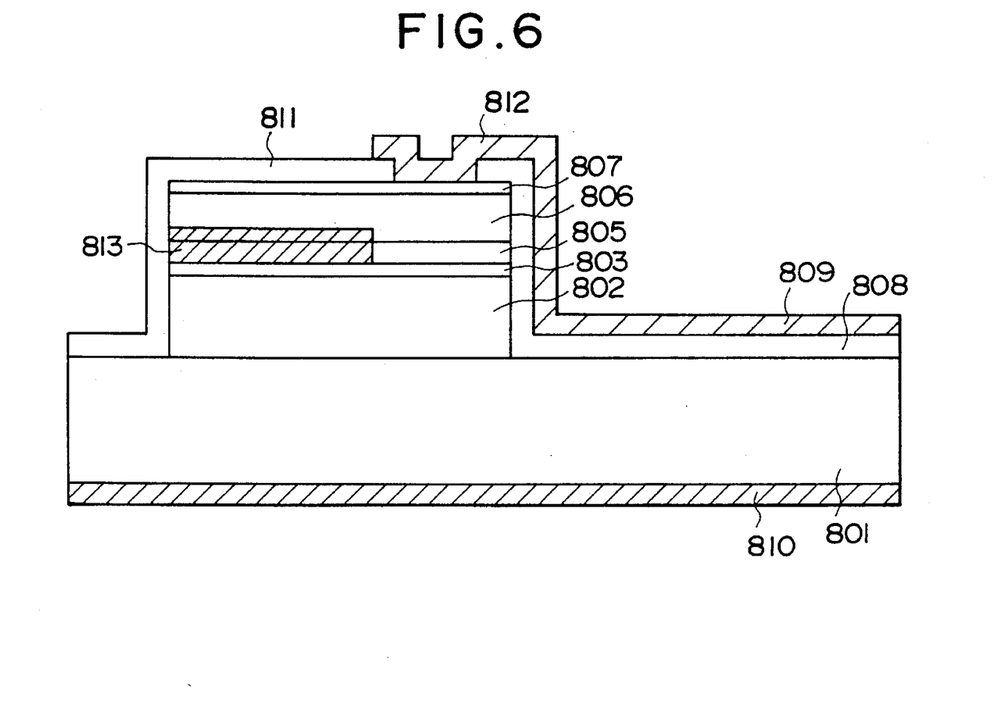
FIG. 6 illustrates a light-emitting diode according to a sixth embodiment.

FIG. 6 shows, in the same manner as FIG. 1B, a light emitting diode according to a sixth embodiment. FIG. 6 shows one of the light-emitting diodes arranged in a straight pattern in the light-emitting diode array like the one shown in FIG. 1A and produced in a monolithic manner.

On the surface of a p-GaAs semiconductor substrate 801 are formed semiconductor films including an p-Al$_{0.4}$Ga$_{0.6}$As (carrier density: $5\times10^{17}$, film thickness: 1 μm) clad layer 802, an n-Al$_{0.2}$Ga$_{0.8}$As (carrier density: $5\times10^{15}$, film thickness: 0.15 μm) light-emitting layer 803, an n-Al$_{0.4}$Ga$_{0.6}$As (carrier density: $1\times10^{16}$, film thickness: 0.15 μm) current block layer 805, an n-Al$_{0.4}$Ga$_{0.6}$As (carrier density: $3\times10^{17}$, film thickness 0.2 μm) current application layer 806, a p-GaAs (carrier density: $3\times10^{18}$, film thickness: 0.05 μm) cap layer 807, in the stated order from bottom to top. That is, the p-Al$_{0.4}$Ga$_{0.6}$As clad layer 802 is formed nearest the semiconductor substrate 801.

The clad layer 802, the light-emitting layer 803, the current block layer 805 and the current application layer 806 constitute a light-emitting part having a double heterostructure. The current block layer 805 constitute an n(–) type layer having a low carrier density and a high resistance.

An insulating layer 808 covers the film layers formed of semiconductor films 802–807. An Au/Ni/Au-Ge/Cr wiring contact 809 formed on the insulating layer 808 is in contact with the cap layer 807 through a contact hole 812 bored in the insulating layer 808.

An ion implantation method is employed to implant n-type impurities $^{28}$Si(–) beneath a light-emitting window 811 so as to increase the carrier density in the current block layer 805 and to form an n-type impurity implantation region 813, the center of the implantation being located in the current block layer 805.

As a result, the carrier density is high and the resistivity is low in the region 813. The current block function owing to the high resistance of the current block layer 805 is canceled locally, thereby forming a region having a current block function in a portion beneath the wiring contact 809.

The current block function of the current block layer 805 is obtained by controlling the carrier density to be low and controlling the resistivity to be high. For proper current block function, the thickness of the current block layer 805 is controlled to be approximately 0.1 μm. In consequence of this, the depth to which the impurity ions are implanted are relatively great. A high-quality implantation is ensured by using, as an n-type impurity, $^{28}$Si(–), which has a relatively small mass number. Since the use of $^{28}$Si(–) ensures that a higher activation yield is obtained under a thermal process of relatively low temperature, $^{28}$Si(–) affects, in an activation process, the carrier density profile in the crystal growth layer to a smaller degree than other implantation materials.

The entire underside of the semiconductor substrate 801 is provided with an Au/Au-Zn contact film 810 which serves as a contact shared by the light-emitting diodes.

When a voltage is applied between the wiring contact 809 and the contact film 810, a drive current flows from the wiring contact 809 to the contact film 810. Since the current block function of the current block layer 805 is effective beneath the wiring contact 809, the current becomes concentrated in the n-type impurity implantation region 813 beneath the light-emitting window 811. Therefore, an emission of bright light in this region 813 results. The emitted light is effectively output through the light-emitting window 811 without being reflected by the wiring contact 809. Accordingly, a high light-production efficiency is obtained.

A schematic description will now be given of an example of the process of producing the light-emitting diode array according to the sixth embodiment described above.

First, a metal organic vapor phase growth method or a molecular beam epitaxial method is employed to sequentially form, on a semiconductor substrate 801, the semiconductor films 802–807. Subsequently, a normal photolithography and an ion implantation method are employed to form the n-type impurity implantation region 813 by implanting n-type impurities ($^{28}$Si(–)) in the region beneath the light-emitting window. The implanted ions are then activated by RTA. Then, the dry etching which reaches the semiconductor substrate 801 is conducted by ECR-RIBE so that the whole of the layers of semiconductor films is segmented to form individual light-emitting diodes. Thereafter, the insulating layer 808 is formed by a plasma CVD method, and a contact hole 812 is bored in the insulating layer 808 on top of the cap layer 807 by a normal photolithography and a wet etching technology. Then, a DC sputtering method and a reactive ion etching method are employed to form the Al wiring contact 809, whereupon the contact film 810 is formed on the underside of the semiconductor substrate by a resistance heating evaporation method.

Figure 7:
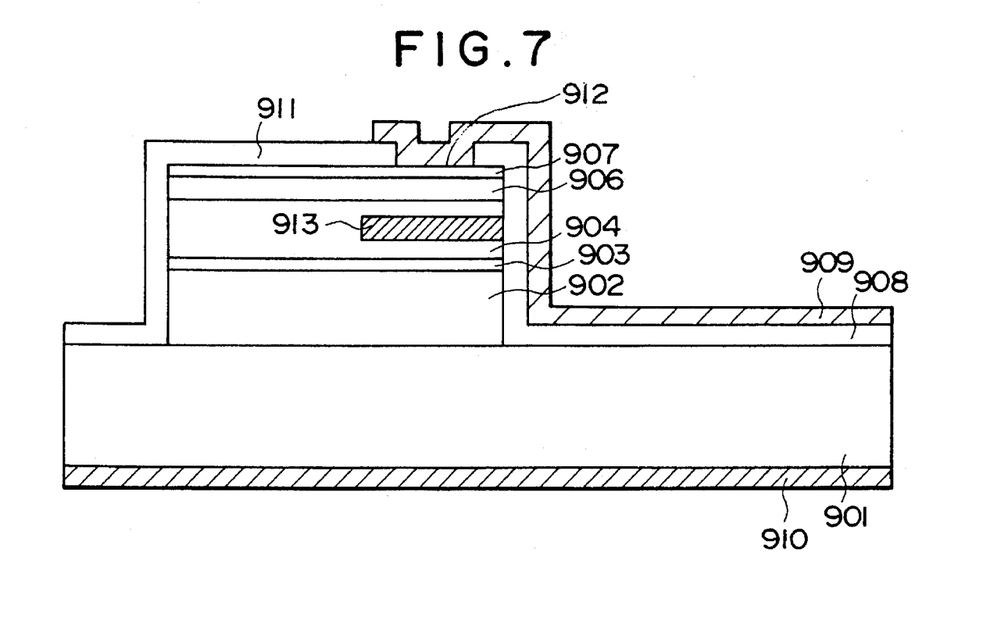
FIG. 7 illustrates a light-emitting diode according to a seventh embodiment.

FIG. 7 shows, in the same manner as FIG. 1B, a light emitting diode according to a seventh embodiment. FIG. 7 shows one of the light-emitting diodes arranged in a straight pattern in the light-emitting diode array like the one shown in FIG. 1A and produced in a monolithic manner.

On the surface of an n-GaAs semiconductor substrate 901 are formed semiconductor films including an n-Al$_{0.4}$Ga$_{0.6}$As (carrier density: 3×10$^{17}$, film thickness: 1 μm) clad layer 902, an n-Al$_{0.2}$Ga$_{0.8}$As (carrier density: 5×10$^{15}$, film thickness: 0.15 μm) light-emitting layer 903, a p-Al$_{0.4}$Ga$_{0.6}$As (carrier density: 1×10$^{17}$, film thickness: 0.1 μm) clad layer 904, a p-Al$_{0.4}$Ga$_{0.6}$As (carrier density: 2×10$^{18}$, film thickness: 0.1 μm) current application layer 506, and a p-GaAs (carrier density: 1×10$^{20}$, film thickness: 0.05 μm) cap layer 907, in the stated order from bottom to top. That is, the n-Al$_{0.4}$Ga$_{0.6}$As clad layer 902 is formed nearest the semiconductor substrate 901.

The clad layer 902, the light-emitting layer 903 and the clad layer 904 constitute a light-emitting part having a double heterostructure.

An insulating layer 908 covers the film layers formed of semiconductor films 902–907. A film-like Al wiring contact 909 formed on the insulating layer 908 is in contact with the cap layer 907 through a contact hole 912 bored in the insulating layer 908.

An ion implantation method is employed to implant n-type impurities $^{28}$Si(–) in the clad layer 904 beneath the wiring contact 909 so as to induce a reversal in the pn polarity in the clad layer 904 and to form an n-type impurity implantation region 913. This region forms a pnp junction together with the layers above and below.

The region 913 is an n-type region in terms of electric conduction and is different from the layers above and below which are p-type regions in terms of electrical conduction. Therefore, the region 913 serves as a current block region.

As described earlier, it is required to form the current block region at a depth on the order of 0.1 μm, considering the carrier density and the width of the depletion layer. $^{28}$Si(–), which is used as an n-type impurity, is suitable for a proper implantation because of its small mass number. Since the use of $^{28}$Si(–) ensures that a high activation yield is obtained under a thermal process of relatively low temperature, it affects, in an activation process, the carrier density profile in the crystal growth layer to a smaller degree than other implantation materials.

The entirety of the underside of the semiconductor substrate 901 is provided with an Au/Ni/Au-Ge contact film 910 which serves as a contact shared by the light-emitting diodes.

When a voltage is applied between the wiring contact 909 and the contact film 910, a drive current flows from the wiring contact 909 to the contact film 910. Since the current block function of the n-type impurity implantation region 913 is effective beneath the wiring contact 909, the current becomes concentrated in the clad layer 904 beneath the light-emitting window 911. Therefore, an emission of bright light in this region results. The emitted light is effectively output through the light-emitting part 911 without being reflected by the wiring contact 909. Accordingly, a high light-production efficiency is obtained.

A schematic description will now be given of an example of the process of producing the light-emitting diode array according to the seventh embodiment described above.

First, a metal organic vapor phase growth method or a molecular beam epitaxial method is employed to sequentially form, on the semiconductor substrate 901, the semiconductor films 902–907. Subsequently, a normal photolithography and an ion implantation method are employed to form the n-type impurity implantation region 913 by implanting n-type impurities ($^{28}$Si(−)) in the clad layer 904 beneath a target part in which the wiring contact 909 is formed, and by inducing a reversal in the pn polarity. The implanted ions are then activated by RTA.

Then, the dry etching which reaches the semiconductor substrate 901 is conducted by ECR-RIBE so that the whole of the layers of semiconductor films is segmented to form individual light-emitting diodes. Thereafter, the insulating layer 908 is formed by a plasma CVD method, and a contact hole 912 is bored in the insulating layer 908 on top of the cap layer 907 by a normal photolithography and a wet etching technology. Then, a DC sputtering method and a reactive ion etching method are employed to form the Al wiring contact 909, whereupon the contact film 910 is formed on the underside of the semiconductor substrate 901 by a resistance heating evaporation method.

Figure 8:
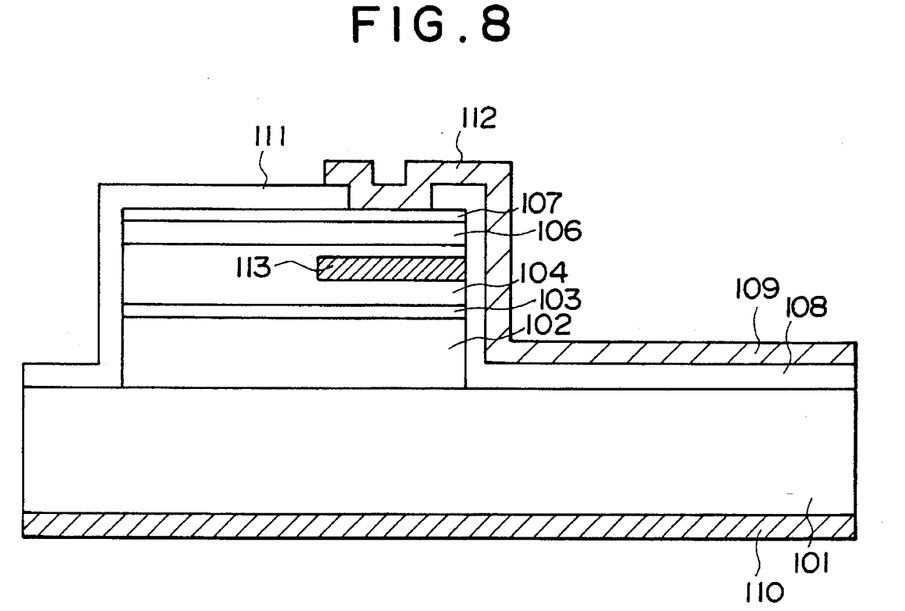
FIG. 8 illustrates a light-emitting diode according to an eighth embodiment.

FIG. 8 shows, in the same manner as FIG. 1B, a light emitting diode according to an eighth embodiment. FIG. 8 shows one of the light-emitting diodes arranged in a straight pattern in the light-emitting diode array like the one shown in FIG. 1A and produced in a monolithic manner.

On the surface of an p-GaAs semiconductor substrate 101 are formed semiconductor films including a p-$Al_{0.4}Ga_{0.6}As$ (carrier density: $5\times10^{17}$, film thickness: 1 μm) clad layer 102, an n-$Al_{0.2}Ga_{0.8}As$ (carrier density: $5\times10^{15}$, film thickness: 0.15 μm) light-emitting layer 103, an n-$Al_{0.4}Ga_{0.6}As$ (carrier density: $1\times10^{17}$, film thickness: 12 μm) clad layer 104, an n-$Al_{0.4}Ga_{0.6}As$ (carrier density: $3\times10^{18}$, film thickness: 0.2 μm) current application layer 106, and an n-GaAs (carrier density: $3\times10^{18}$, film thickness: 0.05 μm) cap layer 107, in the stated order from bottom to top. That is, the p-$Al_{0.4}Ga_{0.6}As$ clad layer 102 is formed nearest the semiconductor substrate 101.

The clad layer 102, the light-emitting layer 103 and the clad layer 104 constitute a light-emitting part having a double heterostructure.

An insulating layer 108 covers the film layers formed of semiconductor films 102–107. A film-like Au/Ni/Au-Ge/Cr wiring contact 109 formed on the insulating layer 108 is in contact with the cap layer 107 through a contact hole 112 bored in the insulating layer 108.

An ion implantation method is employed to implant p-type impurities $^9$Be(+) in the clad layer 104 beneath the wiring contact 109 so as to induce a reversal in the pn polarity in the clad layer 104 and to form a p-type impurity implantation region 113. This region forms a npn junction together with the layers above and below.

The region 113 is a p-type region in terms of electric conduction and is different from the layers above and below which are n-type regions in terms of electrical conduction. Therefore, the region 113 serves as a current block region.

As described earlier, it is required to form the current block region at a depth on the order of 0.1 μm. $^9$Be(+), which is used as a p-type impurity, is suitable for a proper implantation because of its small mass number. Since the use of $^9$Be(+) ensures that a high activation yield is obtained under a thermal process of relatively low temperature, it affects, in an activation process, the carrier density profile in the crystal growth layer to a smaller degree than other implantation materials.

The entirety of the underside of the semiconductor substrate 101 is provided with an Au/Au-Zn contact film 110 which serves as a contact shared by the light-emitting diodes.

When a voltage is applied between the wiring contact 109 and the contact film 110, a drive current flows from the wiring contact 109 to the contact film 110. Since the current block function of the p-type impurity implantation region 113 is effective beneath the wiring contact 109, the current becomes concentrated in the clad layer 904 beneath the light-emitting window 111. Therefore, an emission of bright light in this region results. The emitted light is effectively output through the light-emitting window 111 without being reflected by the wiring contact 109. Accordingly, a high light-production efficiency is obtained.

A schematic description will now be given of an example of the process of producing the light-emitting diode array according to the eighth embodiment described above.

First, a metal organic vapor phase growth method or a molecular beam epitaxial method is employed to sequentially form, on the semiconductor substrate 101, the semiconductor films 102–107. Subsequently, a normal photolithography and an ion implantation method are employed to form the p-type impurity implantation region 113 by implanting p-type impurities ($^9$Be(+)) in the clad layer 104 beneath a target part in which the wiring contact 109 is formed, and by inducing a reversal in the pn polarity. The implanted ions are then activated by RTA.

Then, the dry etching which reaches the semiconductor substrate 101 is conducted by ECR-RIBE so that the whole of the layers of semiconductor films is segmented to form individual light-emitting diodes. Thereafter, the insulating layer 108 is formed by a plasma CVD method, and a contact hole 112 is bored in the insulating layer 108 on top of the cap layer 107 by a normal photolithography and a wet etching technology. Then, a DC sputtering method and a reactive ion etching method are employed to form the Au/Ni/Au-Ge/Cr wiring contact 109, whereupon the contact film 110 is formed on the underside of the semiconductor substrate 101 by a resistance heating evaporation method.

Figure 9:
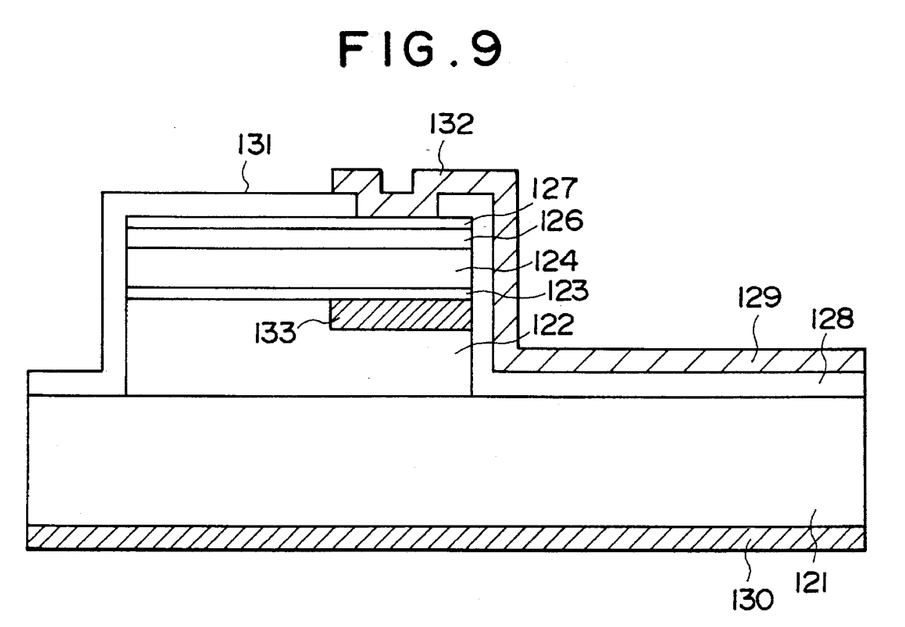
FIG. 9 illustrates a light-emitting diode according to a ninth embodiment.

FIG. 9 shows, in the same manner as FIG. 1B, a light emitting diode according to a ninth embodiment. FIG. 9 shows one of the light-emitting diodes arranged in a straight pattern in the light-emitting diode array like the one shown in FIG. 1A and produced in a monolithic manner.

On the surface of an n-GaAs semiconductor substrate 121 are formed semiconductor films including an n-$Al_{0.4}Ga_{0.6}As$ (carrier density: $3\times10^{17}$, film thickness: 1 μm) clad layer 122, an n-$Al_{0.2}Ga_{0.8}As$ (carrier density: $5\times10^{15}$, film thickness: 0.15 μm) light-emitting layer 123, a p-$Al_{0.4}Ga_{0.6}As$ (carrier density: $5\times10^{17}$, film thickness: 12 μm) clad layer 124, a p-$Al_{0.4}Ga_{0.6}As$ (carrier density: $2\times10^{18}$, film thickness 0.1 μm) current application layer 126, and a p-GaAs (carrier density: $1\times10^{20}$, film thickness: 0.05 μm) cap layer 127, in the stated order from bottom to top. That is, the n-$Al_{0.4}Ga_{0.6}As$ clad layer 122 is formed nearest the semiconductor substrate 121.

The clad layer 122, the light-emitting layer 123 and the clad layer 124 constitute a light-emitting part having a double heterostructure.

An insulating layer 128 covers the film layers formed of semiconductor films 122–127. A film-like Al wiring contact 129 formed on the insulating layer 128 is in contact with the cap layer 127 through a contact hole 132 bored in the insulating layer 128.

An ion implantation method is employed to implant p-type impurities $^9$Be(+) in the clad layer 122 beneath the wiring contact 129 so as to form a p-type impurity implantation region 133. This region is characterized by a high resistance and becomes a current block region having the current block function since the carrier density in that part of the clad layer 122 which is near the light-emitting layer 123 is lowered because of implanted impurities.

Because the energy gap of the clad layer 126 is required to be wider than that of the light-emitting layer 123, the ratio of the Al portion is adjusted to be 0.4 in this embodiment, too. Since the carrier density cannot be raised to an excessively high level, the thickness of the clad layer 124 is controlled to be on the order of 0.1 µm, considering the thickness of the depletion layer. This requires an ion implantation depth of greater than 0.1 µm. $^9$Be(+), which is used as a p-type impurity, is suitable for a proper implantation because of its small mass number. Since the use of $^9$Be(+) ensures that a high activation yield is obtained under a thermal process of relatively low temperature, it affects, in an activation process, the carrier density profile in the crystal growth layer to a smaller degree than other implantation materials.

The entirety of the underside of the semiconductor substrate 121 is provided with an Au/Ni/Au-Ge contact film 130 which serves as a contact shared by the light-emitting diodes.

When a voltage is applied between the wiring contact 129 and the contact film 130, a drive current flows from the wiring contact 129 to the contact film 130. Since the current block function of the p-type impurity implantation region 133 is effective beneath the wiring contact 129, the current becomes concentrated in the clad layer 124 beneath the light-emitting window 121. Therefore, an emission of bright light in this region results. The emitted light is effectively output through the light-emitting part 121 without being reflected by the wiring contact 129. Accordingly, a high light-production efficiency is obtained.

A schematic description will now be given of an example of the process of producing the light-emitting diode array according to the ninth embodiment described above.

First, a metal organic vapor phase growth method or a molecular beam epitaxial method is employed to sequentially form, on the semiconductor substrate 121, the semiconductor films 122–127. Subsequently, a normal photolithography and an ion implantation method are employed to form the p-type impurity implantation region 133 by implanting p-type impurities ($^9$Be(+)) in the clad layer 124 beneath a target part in which the wiring contact 129 is formed. The implanted ions are then activated by RTA.

Then, the dry etching which reaches the semiconductor substrate 121 is conducted by ECR-RIBE so that the whole of the layers of semiconductor films is segmented to form individual light-emitting diodes. Thereafter, the insulating layer 128 is formed by a plasma CVD method, and a contact hole 132 is bored in the insulating layer 128 on top of the cap layer 127 by a normal photolithography and a wet etching technology. Then, a DC sputtering method and a reactive ion etching method are employed to form the Al wiring contact 129, whereupon the contact film 130 is formed on the underside of the semiconductor substrate 121 by a resistance heating evaporation method.

Figure 10:
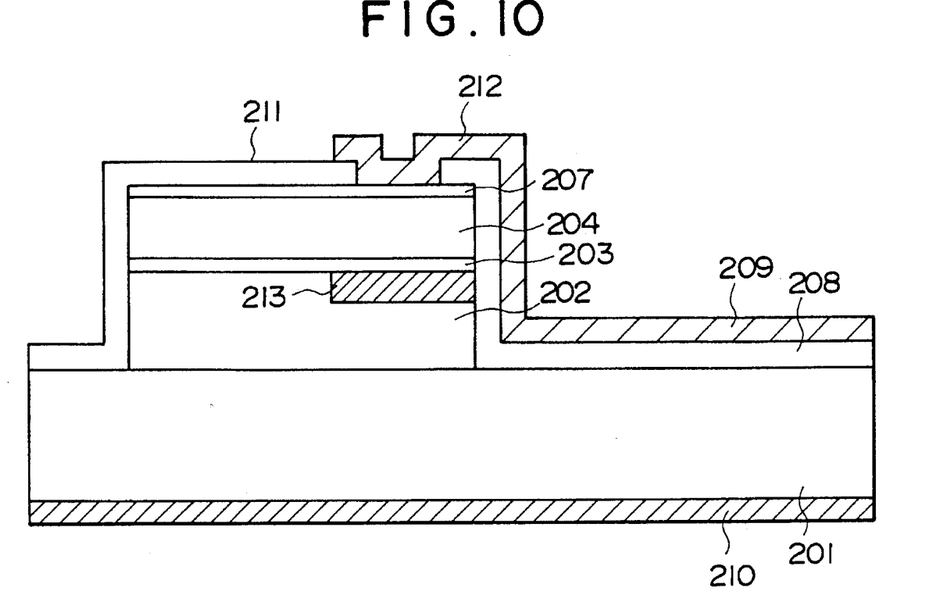
FIG. 10 illustrates a light-emitting diode according to a tenth embodiment.

FIG. 10 shows, in the same manner as FIG. 1B, a light emitting diode according to a tenth embodiment. FIG. 10 shows one of the light-emitting diodes arranged in a straight pattern in the light-emitting diode array like the one shown in FIG.1A and produced in a monolithic manner.

On the surface of an n-GaAs semiconductor substrate 201 are formed semiconductor films including an p-Al$_{0.4}$Ga$_{0.6}$As (carrier density: $5\times10^{17}$, film thickness: 1 µm) clad layer 202, an n-Al$_{0.2}$Ga$_{0.8}$As (carrier density: $5\times10^{15}$, film thickness: 0.1 µm) light-emitting layer 203, an n-Al$_{0.4}$Ga$_{0.6}$As (carrier density: $3\times10^{17}$, film thickness: 0.2 µm) clad layer 204, and an n-GaAs (carrier density: $1\times10^{20}$, film thickness: 0.05 µm) cap layer 207, in the stated order from bottom to top. That is, the p-Al$_{0.4}$Ga$_{0.6}$As clad layer 202 is formed nearest the semiconductor substrate 201.

The clad layer 202, the light-emitting layer 203 and the clad layer 204 constitute a light-emitting part having a double heterostructure.

An insulating layer 208 covers the film layers formed of semiconductor films 202–207. A film-like Au/Ni/Au-Ge/Cr wiring contact 209 formed on the insulating layer 208 is in contact with the cap layer 207 through a contact hole 212 bored in the insulating layer 208.

An ion implantation method is employed to implant n-type impurities $^{28}$Si(−) in the clad layer 202 beneath the wiring contact 209 so as to form a n-type impurity implantation region 213. This region is characterized by a high resistance and becomes a current block region having the current block function since the carrier density in that part of the clad layer 202 which is near the light-emitting layer 203 is lowered because of implanted impurities.

Because the energy gap of the clad layer 204 is required to be wider than that of the light-emitting layer 203, the ratio of the Al portion is adjusted to be 0.4 in this embodiment, too. Since the carrier density cannot be raised to an excessively high level, the thickness of the clad layer 204 is controlled to be on the order of 0.1 µm, considering the thickness of the depletion layer. This requires an ion implantation depth of greater than 0.1 µm. $^{28}$Si(−), which is used as a n-type impurity, is suitable for a proper implantation because of its small mass number. Since the use of $^{28}$Si(−) ensures that a high activation yield is obtained under a thermal process of relatively low temperature, it affects, in an activation process, the carrier density profile in the crystal growth layer to a smaller degree than other implantation materials.

The entirety of the underside of the semiconductor substrate 201 is provided with an Au/Au-Zn contact film 210 which serves as a contact shared by the light-emitting diodes.

When a voltage is applied between the wiring contact 209 and the contact film 210, a drive current flows from the wiring contact 209 to the contact film 210. Since the current block function of the n-type impurity implantation region 213 is effective beneath the wiring contact 209, the current becomes concentrated in the clad layer 202 beneath the light-emitting window 212. Therefore, an emission of bright light in this region results. The emitted light is effectively output through the light-emitting part 211 without being reflected by the wiring contact 209. Accordingly, a high light-production efficiency is obtained.

A schematic description will now be given of an example of the process of producing the light-emitting diode array according to the tenth embodiment described above.

First, a metal organic vapor phase growth method or a molecular beam epitaxial method is employed to sequentially form, on the semiconductor substrate 201, the semiconductor films 202–207. Subsequently, a normal photolithography and an ion implantation method are employed to form the n-type impurity implantation region 213 by implanting n-type impurities ($^{28}$Si(−)) in the clad layer 202 beneath a target part in which the wiring contact 209 is formed. The implanted ions are then activated by RTA.

Then, the dry etching which reaches the semiconductor substrate 201 is conducted by ECR-RIBE so that the whole of the layers of semiconductor films is segmented to form individual light-emitting diodes. Thereafter, the insulating layer 208 is formed by a plasma CVD method, and a contact hole 212 is bored in the insulating layer 208 on top of the cap layer 207 by a normal photolithography and a wet etching technology. Then, a DC sputtering method and a reactive ion etching method are employed to form the wiring contact 209, whereupon the contact film 210 is formed on the underside of the semiconductor substrate 201 by a resistance heating evaporation method.

Figure 11:
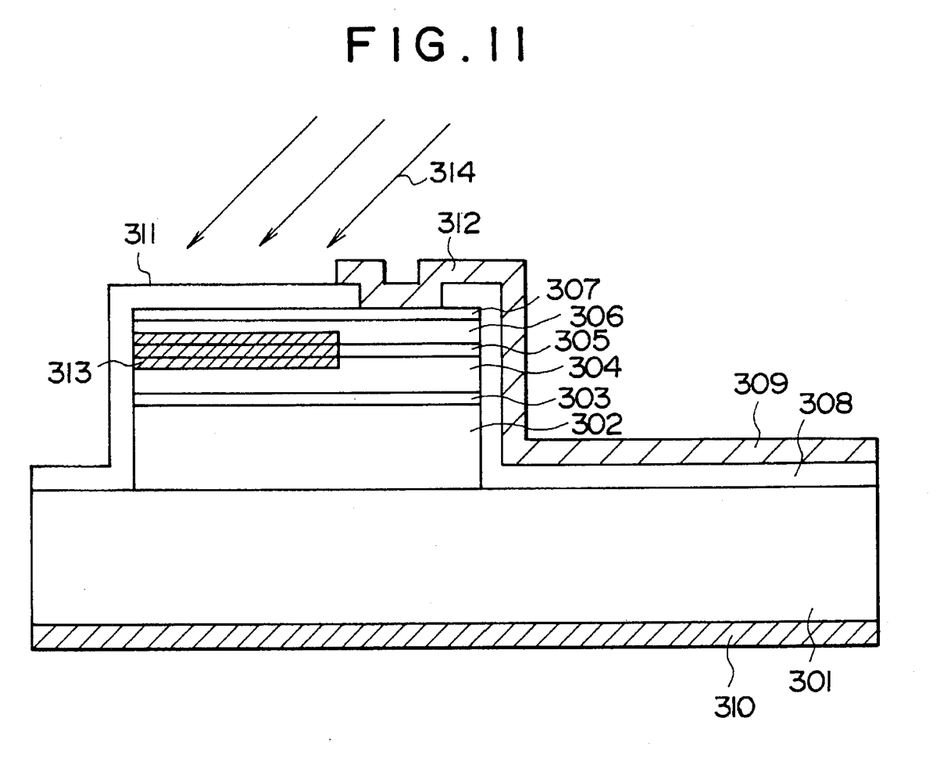
FIG. 11 illustrates a light-emitting diode according to an eleventh embodiment.

FIG. 11 shows, in the same manner as FIG. 1B, a light emitting diode according to an eleventh embodiment. FIG. 11 shows one of the light-emitting diodes arranged in a straight pattern in the light-emitting diode array like the one shown in FIG. 1A and produced in a monolithic manner.

On the surface of an n-GaAs semiconductor substrate 301 are formed semiconductor films including an n-$Al_{0.4}Ga_{0.6}As$ (carrier density: $3\times10^{17}$, film thickness: 1 μm) clad layer 302, an n-$Al_{0.2}Ga_{0.8}As$ (carrier density: $5\times10^{15}$, film thickness: 0.15 μm) light-emitting layer 303, a p-$Al_{0.4}Ga_{0.6}As$ (carrier density: $1\times10^{17}$, film thickness: 0.7 μm) clad layer 304, a n-$Al_{0.4}Ga_{0.6}As$ (carrier density: $3\times10^{17}$, film thickness 0.2 μm) current block layer 305, a p-$Al_{0.4}Ga_{0.6}As$ (carrier density $1\times10^{18}$, film thickness 0.2 μm) current application layer 306 and a p-GaAs (carrier density: $1\times10^{20}$, film thickness: 0.05 μm) cap layer 307, in the stated order from bottom to top. That is, the n-$Al_{0.4}Ga_{0.6}As$ clad layer 302 is formed nearest the semiconductor substrate 301.

In the construction comprising the clad layer 302, the light-emitting layer 303 and the clad layer 304, the np region near the semiconductor substrate 301 constitutes a light-emitting part having a double heterostructure. In a basic npnp structure formed on the semiconductor substrate 301, the current block layer 305 constitutes a second n-type semiconductor film further away from the semiconductor substrate 301 than a first n-type semiconductor film.

An insulating layer 308 covers the film layers formed of semiconductor films 302–307. A film-like Al wiring contact 309 formed on the insulating layer 308 is in contact with the cap layer 307 through a contact hole 312 bored in the insulating layer 308.

P-type impurities $^9Be(+)$ are implanted in the region beneath a light-emitting window 311 so as to form a p-type impurity implantation region 313, the center of implantation being located in the current block layer 305. Due to the implanted p-type impurities, a reversal in the pn polarity occurs in this region 313 and the region has the same electric conduction type as the p-type region on either side of the current block layer 305, so that the current block function characteristic of the current block layer 305 is canceled locally. Hence, the region having the current block function of the current block layer 305 is formed beneath the contact 309.

In this embodiment, $^9Be(+)$ is implanted from a source slightly displaced toward the wiring contact 309 so that the implantation can be performed in a slightly oblique direction with respect to the normal of the surface of the light-emitting window 311. In this way, the density of the impurities ($^9Be(+)$) in the p-type impurity region 313 becomes gradually higher away from the end of the wiring contact 309 toward the light-emitting window. That is, the density of the impurities has a certain distribution in a direction (from left to right in the figure) parallel to the surface of the semiconductor substrate 301.

An ion implantation depth on the order of 0.1 μm is required in this embodiment, too. $^9Be(+)$, which is used as a p-type impurity, is suitable for creating such a deep implantation layer because of its relatively small mass number. Since the use of $^9Be(+)$ ensures that a high activation yield is obtained under a thermal process of relatively low temperature, it affects, in an activation process, the carrier density profile in the crystal growth layer to a smaller degree than other implantation materials.

The entirety of the underside of the semiconductor substrate 301 is provided with an Au/Ni/Au-Ge contact film 310 which serves as a contact shared by the light-emitting diodes.

When a voltage is applied between the wiring contact 309 and the contact film 310, a drive current flows from the wiring contact 309 to the contact film 310. Since the current block function of the current block layer 305 is effective beneath the wiring contact 309, the current becomes concentrated in the p-type impurity implantation region 313. Therefore, an emission of bright light beneath the region 313 results. The emitted light is effectively output through the light-emitting part 311 without being reflected by the wiring contact 309. Accordingly, a high light-production efficiency is obtained.

Conventionally, a method, whereby the carrier density of the current application layer is controlled to be high and the resistivity therein is controlled to be low, has been employed as a method to have the carriers uniformly implanted in the light-emitting part. However, as has been described previously, there is a limit to increasing the carrier density of the current application layer, resulting in a limit to providing a uniform light-emitting intensity.

Since this embodiment is characterized by a carrier density distribution (the density of p-type impurities in the p-type impurity implantation region 313) which is higher away from the end of the wiring contact 309 toward the light-emitting window, a drift electric field parallel to the surface of the semiconductor substrate 301 is created so that implanted carriers are accelerated in a direction away from the wiring contact 309 and toward the light-emitting window 311 (that is, from right to left in FIG. 11). As a result, the distribution of the intensity of the light emitted from the light-emitting window 311, in the direction parallel to the surface of the semiconductor substrate 301, can be made more uniform than in the conventional technology.

A schematic description will now be given of an example of the process of producing the light-emitting diode array according to the eleventh embodiment described above.

First, a metal organic vapor phase growth method or a molecular beam epitaxial method is employed to sequentially form, on the n-GaAs semiconductor substrate 301, the semiconductor films 302–307.

Subsequently, a normal photolithography and an ion implantation method are employed to form the p-type impurity implantation region 313 by implanting p-type impurities ($^9Be(+)$) in the region beneath a target part which is intended to be the light-emitting window, the center of the implantation being in the current block layer 305, and the implanting beam impinging the target region at an angle. The implanted ions are then activated by RTA.

Then, the dry etching which reaches the semiconductor substrate 301 is conducted by ECR-RIBE so that the whole of the layers of semiconductor films is segmented to form individual light-emitting diodes.

Thereafter, the $SiO^2$ insulating layer 308 is formed by a plasma CVD method, and a contact hole 312 is bored in the insulating layer on top of the cap layer 307 by a normal photolithography and a wet etching technology. Then, a DC sputtering method and a reactive ion etching method are employed to form the wiring contact 309, whereupon the contact film 310 is formed on the underside of the semiconductor substrate 301 by a resistance heating evaporation method.

As has been described, the present invention provides a novel light-emitting diode and a novel light-emitting diode array. Since the light-emitting diode and the light-emitting diode array of the present invention have the above described construction, it is possible to obtain a light output at a high light-producing efficiency even with a surface emitting construction.

In another aspect of the present invention, an ion implantation method is employed to implant impurities so that the semiconductor film is affected by heat during an implantation to a relatively small degree, and only a relatively small change occurs in the impurity profile after a doping process. Hence, a degradation, with time, in the light-producing efficiency in the light-emitting part can be effectively reduced.

In still another aspect of the invention described above, the implanted impurities have a irregular distribution in a direction parallel to the surface of the semiconductor substrate so that the carriers are accelerated in the same direction. Hence, the light density in the light-emitting part can be made uniform in an effective manner.

The present invention is not limited to the above described embodiments, and variations and modifications may be made without departing from the scope of the present invention.

What is claimed is:

1. A light-emitting diode of a surface-emitting type, which comprises:
    a layered structure on a semiconductor substrate, said layered structure and said semiconductor substrate having first and second side walls, and said layered structure includes a light-emitting portion extending from said first side wall to said second side wall, and a current blocking portion adjacent said light-emitting portion and extending from said first side wall to said second side wall, wherein said light-emitting portion is configured to permit current to flow through said portion of said layered structure to generate light, and wherein said current blocking portion is configured to block the flow of current through said portion of said layered structure;
    a first electrode positioned on a portion of said layered structure and extending from said first side wall to said second side wall, such that said first electrode is aligned with said current blocking portion;
    a second electrode positioned on at least a portion of said semiconductor substrate; and
    a light-transmissive window positioned on a portion of said layered structure and extending from said first side wall to said second side wall, said light-transmissive window being laterally spaced from said first electrode and substantially aligned with said light-emitting portion, such that when a voltage is applied between said first and second electrodes, a current flows through said light-emitting portion to generate light therefrom so as to emit said generated light from said light-transmissive window.

2. The light-emitting diode according to claim 1, wherein said layered structure comprises a layer having a current blocking region performing a current blocking function, said current blocking region is in said current blocking portion and is doped with impurities preventing the flow of current through said blocking portion, and further having a current conducting region performing an electrical current conducting function, said current conducting region is laterally spaced from said current blocking region and is in said light-emitting portion and is doped with impurities permitting the flow of current through said light-emitting portion.

3. The light-emitting diode according to claim 2, wherein said current conducting region of said layer is doped with p-type impurities and said light-emitting portion comprises pn structure.

4. The light-emitting diode according to claim 2, wherein said current conducting region of said layer is doped with n-type impurities and said light-emitting portion comprises np structure.

5. The light-emitting diode according to claim 2, wherein said current blocking region of said layer is doped with n-type impurities and said current blocking portion comprises pnpn structure.

6. The light-emitting diode according to claim 2, wherein said current blocking region of said layer is doped with p-type impurities and said current blocking portion comprises npnp structure.

7. A light-emitting diode array which comprises a plurality of light-emitting diodes monolithically constructed to form a diode array, each of said light-emitting diodes having:
    a layered structure on a semiconductor substrate, said layered structure and said semiconductor substrate having first and second side walls, and said layered structure includes a light-emitting portion extending from said first side wall to said second side wall, and a current blocking portion adjacent said light-emitting portion and extending from said first side wall to said second side wall, wherein said light-emitting portion is configured to permit current to flow through said portion of said layered structure to generate light, and wherein said current blocking portion is configured to block the flow of current through said portion of said layered structure;
    a first electrode positioned on a portion of said layered structure and extending from said first side wall to said second side wall, such that said first electrode is aligned with said current blocking portion;
    a second electrode positioned on at least a portion of said semiconductor substrate; and
    a light-transmissive window positioned on a portion of said layered structure and extending from said first side wall to said second side wall, said light-transmissive window being laterally spaced from said first electrode and substantially aligned with said light-emitting portion, such that when a voltage is applied between said first and second electrodes, a current flows through said light-emitting portion to generate light therefrom so as to emit said generated light from said light-transmissive window.

8. The light-emitting diode array according to claim 7, wherein said layered structure comprises a layer having a current blocking region performing a current blocking function, said current blocking region is in said current blocking portion and is doped with impurities preventing the flow of current through said blocking portion, and further having a current conducting region performing an electrical current conducting function, said current conducting region is laterally spaced from the current blocking region and is in said light-emitting portion and is doped with impurities permitting the flow of current through said light-emitting portion.

9. The light-emitting diode array according to claim 8, wherein said current conducting region of said layer is doped with p-type impurities and said light-emitting portion comprises pn structure.

10. The light-emitting diode array according to claim 8, wherein said current conducting region of said layer is doped with n-type impurities and said light-emitting portion comprises np structure.

11. The light-emitting diode array according to claim 8, wherein said current blocking region of said layer is doped with n-type impurities and said current blocking portion comprises pnpn structure.

12. The light-emitting diode array according to claim 8, wherein said current blocking region of said layer is doped with p-type impurities and said current blocking portion comprises npnp structure.

* * * * *